United States Patent [19]

Tamura

[11] 4,262,260
[45] Apr. 14, 1981

[54] TONE CONTROL CIRCUITRY

[75] Inventor: Eijiro Tamura, Tokyo, Japan

[73] Assignee: Trio Kabushiki Kaisha, Tokyo, Japan

[21] Appl. No.: 67,203

[22] Filed: Aug. 16, 1979

[30] Foreign Application Priority Data

Aug. 18, 1978 [JP] Japan ................................ 53-100598
Sep. 18, 1978 [JP] Japan ................................ 53-114279
Sep. 18, 1978 [JP] Japan ................................ 53-114280

[51] Int. Cl.³ .......................... H03F 1/34; H03G 5/08
[52] U.S. Cl. ................................. 330/109; 179/1 D;
330/294; 330/304; 333/28 T
[58] Field of Search ............... 330/107, 109, 294, 304;
333/28 T; 179/1 D

[56] References Cited
U.S. PATENT DOCUMENTS 3,059,190 10/1962 Hafler ................................ 330/92

*Primary Examiner*—James B. Mullins
*Attorney, Agent, or Firm*—Gerald J. Ferguson, Jr.;
Joseph J. Baker

[57] ABSTRACT

A tone control circuit including an operational amplifier having (a) an input circuit or output circuit and (b) a feedback circuit where circuits (a) and (b) are symmetrically disposed with respect to a reference potential such as ground. Circuitry is also provided to compensate for load and/or feedback impedances. Further, circuitry is provided to reduce the number of switches and capacitors needed to vary the high and low cut-off frequencies of the tone control circuit.

22 Claims, 30 Drawing Figures

FIG. 4a
(PRIOR ART)
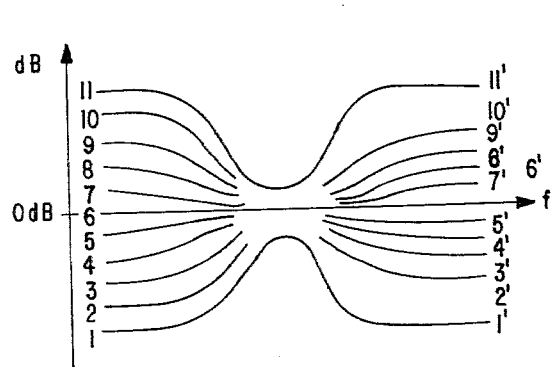
FIG. 4b
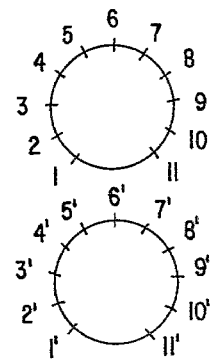
FIG. 4c
FIG. 5
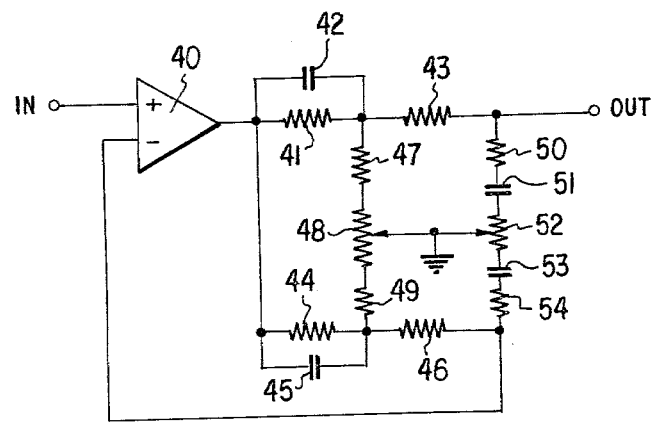
FIG. 6
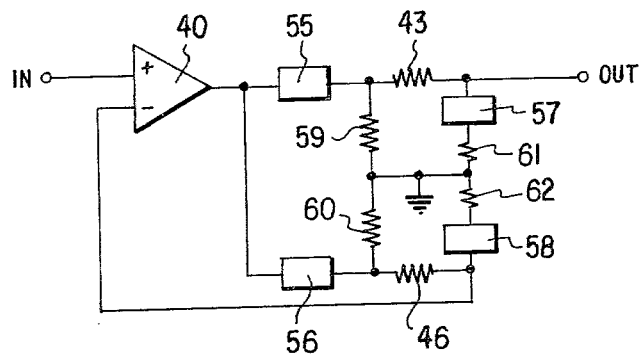

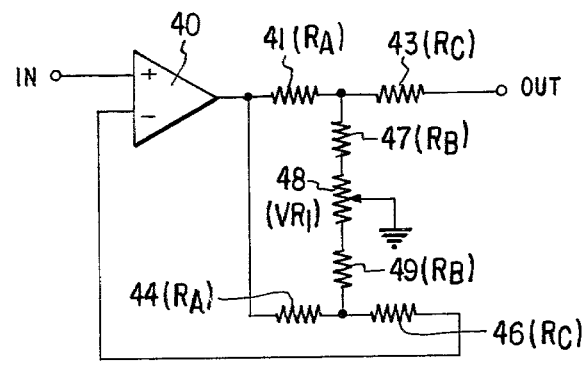
FIG. 11
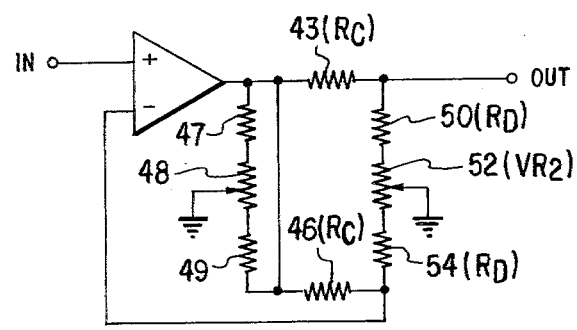
FIG. 12
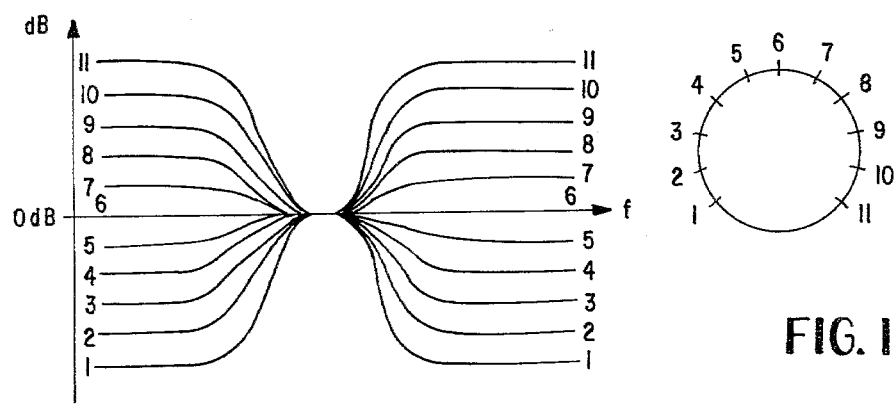
FIG. 13a
FIG. 13b

FIG. 27
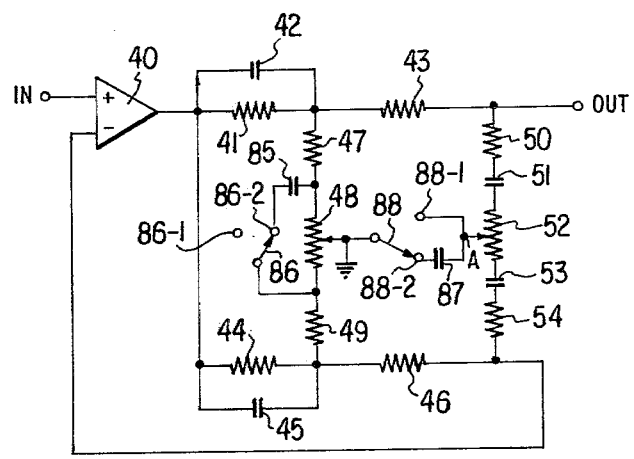
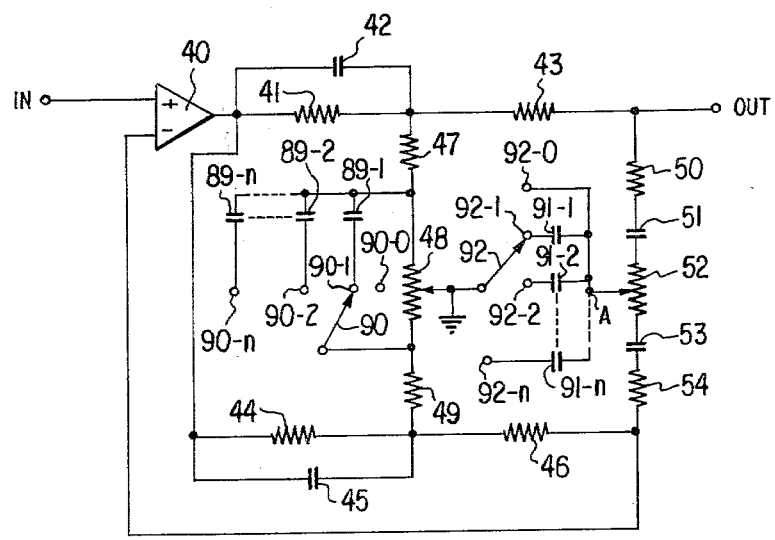
FIG. 28

FIG. 29
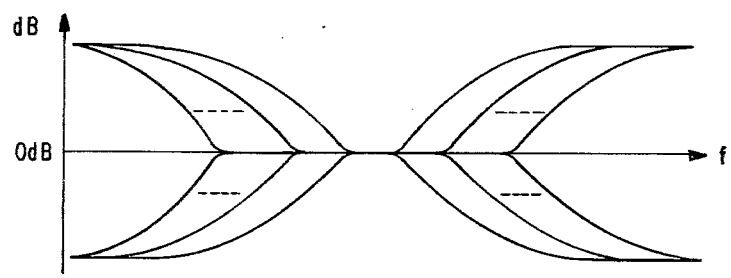
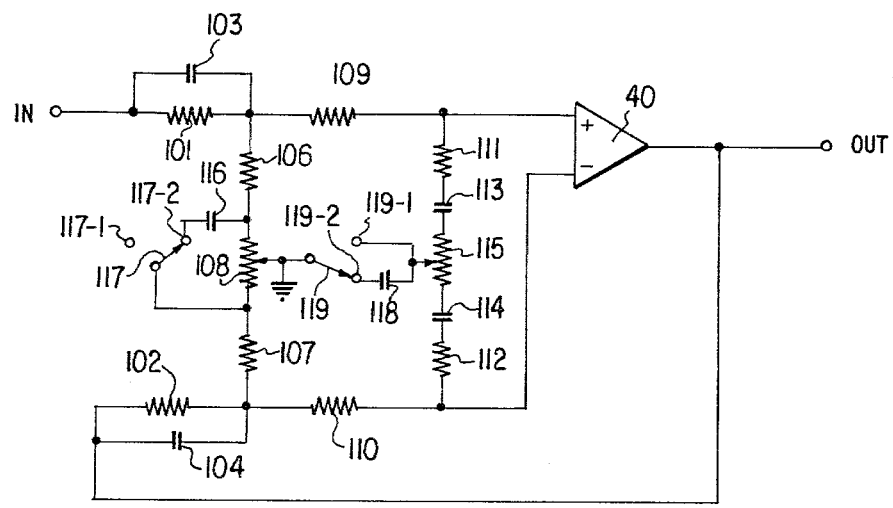
FIG. 30

TONE CONTROL CIRCUITRY

BACKGROUND AND OBJECTS OF THE INVENTION

This invention relates to tone control circuits.

Conventionally, a negative feedback type tone control circuit, a capacitance-resistance (CR) attenuation type tone control circuit and a CR-negative feedback type tone control circuit, has been available for boosting or cutting high-pass or low-pass in a sound system in order to control tone. A known negative feedback tone control circuit as shown in FIG. 1 is comprised of an inverting amplifier 1, resistors 2, 3, 4 and 5, capacitors 6, 7 and 8 and variable resistors 9 and 10. Low-pass boosting or cutting is controlled by variable resistor 9 and high-pass boosting or cutting by variable resistor 10. Shortcomings exist in this circuit such as (a) the phase between the input and output inverts and (b) due to the low input impedance and presence of a frequency characteristic, a buffer amplifier with low output impedance is always required at the previous stage.

A known CR-attenuation type tone control circuit as shown in FIG. 2 is comprised of resistors 11, 12, 13, 14, 15 and 16, capacitors 17, 18, 19 and 20, and variable resistors 21 and 22. Low-pass boosting or cutting is controlled by variable resistor 21 and high pass boosting or cutting by variable resistor 22. Shortcomings exist in this circuit such as (a) the insertion loss is extremely large, (b) due to the low input impedance and presence of a frequency characteristic, a buffer amplifier with a low output impedance is always required at the previous stage, (c) variable resistors 21 and 22 must be A-type variable resistors which have a complex rotation angle to resistance variability characteristic and thus have poor precision and produce greater errors thereby causing waviness in the flat area of the tone control characteristics, (d) frequent interference between the low-pass side circuits and the high-pass side circuits makes designing extremely difficult, and (e) when variable resistors having identical rotation angle to resistance variability characteristics are used for the high-pass and low-pass variable resistors, the ratios of boosting and cutting variations to the rotation angles of the sliders of the variable resistors are different between the treble and the bass as shown in FIGS. 4(a), (b) and (c) where FIG. 4(a) shows tone control characteristics, FIG. 4(b) shows the rotation angle of the slider of the low-pass variable resistor and FIG. 4(c) shows the rotation angle of the slider of the high-pass variable resistor. Common numerals are used in FIGS. 4(a), (b) and (c).

The known CR-negative feedback tone control, circuit, as shown in FIG. 3, is a CR-attenuation type tone control circuit inserted into the negative feedback loop of the inverting amplifier. It is comprised of an inverting amplifier 1, resistors 23, 24, 25, 26 and 27, capacitors 28, 29, 30 and 31 and variable resistors 32 and 33. The high-pass boosting and cutting and low-pass boosting and cutting are effected respectively by controlling variable resistors 32 and 33. Shortcomings exist in this circuit such as (a) contrary to the CR-attenuation type tone control circuit, it has a gain, (b) the variable resistors must be C-type variable resistors with complex rotation angle to resistance variability characteristics, which have poor precision and produce greater errors, thereby causing waviness in the flat area of the tone control characteristics, (c) frequent interference between the low-pass side circuits and the high-pass side circuits makes designing extremely difficult, (d) when variable resistors having identical rotation angle to resistance variability characteristics are used for the high-pass and low-pass variable resistors, the ratios of boosting and cutting variations to the rotation angles of the sliders of the variable resistors are different between the treble and the bass as shown in FIGS. 4(a), (b) and (c).

In particular, the shortcoming (e) in the CR-attenuation type tone control circuit, which is the shortcoming (d) in the CR-negative feedback type tone control circuit, is an important shortcoming, it being attributable to the interference of the bass side circuits on the treble side circuits. In order to eliminate this shortcoming, variable resistors with different resistance variability characteristics to rotation angle of the variable resistor must be used as the high-pass side and low-pass side variable resistors. Thus, it has a shortcoming of requiring variable resistors with markedly complex characteristics.

It is thus a primary object of this invention to provide an improved tone control circuit that eliminates the above shortcomings, particularly a tone control circuit that has less interference between the treble side circuits and the bass side circuits and one that can equalize the boosting and cutting variation ratios for the treble and the bass by using variable resistors with a linear rotation angle to resistance variability characteristics.

Other objects and advantages of this invention will be apparent from a reading of the following specification and claims taken with the drawing.

BRIEF DESCRIPTION OF THE DRAWINGS

FIGS. 4(a), (b) and (c) are diagrams showing the tone control characteristics and the slider rotation angles of high-pass and low-pass variable resistors of conventional tone control circuits.

FIG. 5 is a circuit diagram of an illustrative embodiment of a tone control circuit in accordance with this invention.

FIG. 6 is a circuit diagram of a circuit equivalent to the tone control circuit of FIG. 5 with the slider of the variable resistor in the central position.

FIGS. 7 and 12 are circuit diagrams of high-pass circuits equivalent to the tone control circuit in FIG. 5.

FIG. 8 is a high-pass tone control characteristic diagram of the tone control circuit of FIG. 5.

FIGS. 9 and 11 are circuit diagrams of low-pass circuits equivalent to the tone control circuit of FIG. 5.

FIG. 10 is a low-pass tone control characteristic diagram of the tone control circuit of FIG. 5.

FIGS. 13(a) and (b) are a tone control characteristic diagram and a diagram showing the slider rotation angle of the high-pass and low-pass variable resistors of the tone control circuit of FIG. 5.

FIG. 27 is a circuit diagram of a tone control circuit of a further, modified embodiment of this invention.

FIG. 28 is a circuit diagram of the tone control circuit of another modified embodiment of this invention.

FIG. 29 is the tone control characteristic diagram of the tone control circuit of FIG. 28.

FIG. 30 is a circuit diagram of a tone control circuit of a further, modified embodiment of this invention.

DETAILED DESCRIPTION OF PREFERRED EMBODIMENTS OF THE INVENTION

Figure 1:
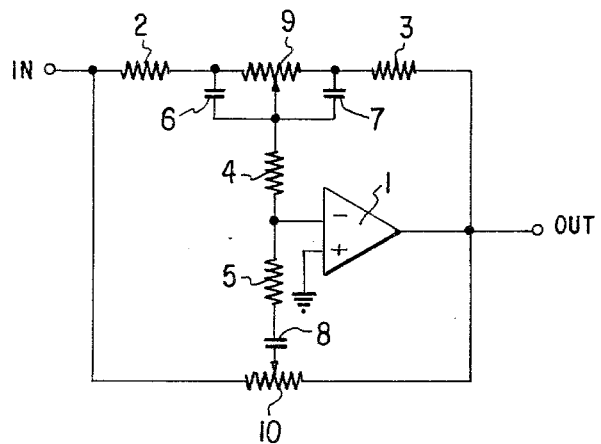
FIG. 1 is a circuit diagram of a conventional negative feedback type tone control circuit.
Figure 2:
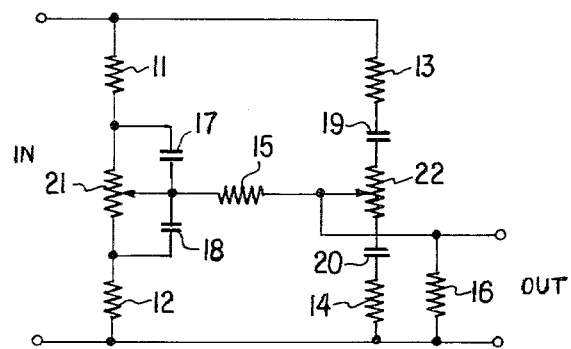
FIG. 2 is a circuit diagram of a conventional CR-attenuation type tone control circuit.
Figure 3:
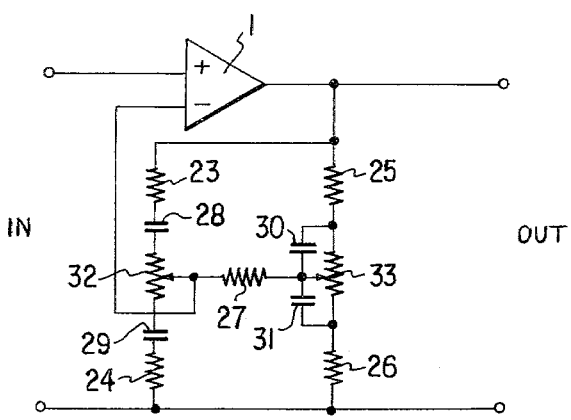
FIG. 3 is a circuit diagram of a conventional CR-negative feedback type tone control circuit.

Reference should be made to the drawing where like reference numerals refer to like parts.

In FIG. 5, the voltage at the input terminal IN of the tone control circuit is applied to the non-inverting input terminal of a non-inverting operational amplifier 40. To the output of amplifier 40 are connected (a) a parallel circuit of resistor 41 and capacitor 42, (b) a resistor 43 serially connected to the parallel circuit, (c) a parallel circuit of resistor 44 and capacitor 45 and (d) a resistor 46 serially connected to this parallel circuit. Between the common connection point of resistors 41 and 43 and the common connection point of resistors 44 and 46 are connected, resistor 47, variable resistor 48, and resistor 49 in series. Between the other terminal of resistor 43 and the other terminal of resistor 46 are connected, resistor 50, capacitor 51, variable resistor 52, capacitor 53, and resistor 54 in series. The other terminal of resistor 43 is connected to the output terminal OUT of the tone control circuit. The other terminal of resistor 46 is connected to the inverting input terminal of amplifier 40. The sliders of variable resistors 48 and 52 are grounded, the circuit being in complete symmetry with respect to the sliders of variable resistors 48 and 52.

The parallel circuit of resistor 41 and capacitor 42 is connected to series with the $\pi$ type circuit that consists of resistor 47, the resistor between the terminal of variable resistor 48 on the resistor 47 side and the slider, resistors 43 and 50, capacitor 51, and the resistor between the terminal of variable resistor 52 on the capacitor 51 side and the slider. These elements comprise the output circuit of amplifier 40. Similarly, the parallel circuit of resistor 44 and capacitor 45 is connected in series with the $\pi$ type circuit that consists of resistor 49, the resistor between the terminal of the variable resistor 48 on resistor 49 side and the slider, resistors 46 and 54, capacitor 53, and the resistor between the terminal of the variable resistor 52 on capacitor 53 side and the slider. They comprise the feedback circuit of the non-inverting amplifier 40. Further, the circuit consisting of resistors 41, 44, 47 and 49, capacitors 42 and 45, and variable resistor 48 comprises the low-pass side circuit whereas resistors 50 and 54, capacitors 51 and 53, and variable resistor 52 comprise the high-pass side current.

The respective resistances of resistors 41 and 44 may be denoted as $R_A$, the respective resistances of resistors 47 and 49 as $R_B$, the respective resistances of resistors 43 and 46 as $R_C$, the respective resistances of resistors 50 and 54 as $R_D$ the respective capacitances of capacitors 42 and 45 as $C_A$, the respective capacitances of capacitors 51 and 53 as $C_B$, the resistance between the slider of variable resistor 48 and the terminal of variable resistor 48 on the resistor 47 side as $r_1$, similarly, the resistance between the terminal of variable resistor 48 on the resistor 49 side and the slider as $r_2$, the resistance between the slider of the variable resistor 52 and the terminal of variable resistor 52 on the capacitor 51 side as $r_3$, and the resistance between the terminal of the variable resistor 52 on the capacitor 53 side and the slider as $r_4$.

When the parallel circuit of resistor 41 and capacitor 42 is expressed as an impedance circuit 55 (see FIG. 6) and the parallel circuit of resistor 44 and capacitor 45 as the impedance circuit 56, the impedances of the impedance circuits 55 and 56 are preferably equal, which is denoted as $Z_A$. Also, when the series circuit of resistor 50 and capacitor 51 is denoted as impedance circuit 57, and the series circuit of resistor 54 and capacitor 53, as impedance circuit 58, the impedances of the impedance circuits 57 and 58 are preferably equal which is denoted as $Z_B$. Variable resistors 48 and 52 are preferably variable resistors that divide the total resistances $V_{R1}(=r_1+r_2)$ and $V_{R2}(=r_3+r_4)$ into two at the center of the rotation angle of the slider-that is, B-type variable resistors, for example. Thus, when the sliders of variable resistors 48 and 52 are set, their respective centers of the rotation angle, $r_1=r_2=V_{R1}/2$ and $r_3=r_4=V_{R2}/2$ and the equivalent circuit shown in FIG. 6 results. In FIG. 6, resistors 59 and 60 are those having a resistance of $R_B+V_{R1}/2$, and resistors 61 and 62 are those having a resistance of $V_{R2}/2$.

As is clear from the equivalent circuit diagram of FIG. 6, the absolute value of the output circuit attenuation of non-inverting amplifier 40 and the absolute value of the amplification due to negative feedback are absolutely identical so that by cancelling each other, the transfer function of FIG. 6 becomes one. Consequently, when the sliders of variable resistors 48 and 52 are set at the centers of their rotation angles, the gain is 1 at any frequency of input signal and the phase is the same between the input and the output. This indicates that when the sliders of variable resistors 48 and 52 are set at the centers of their rotation angles, the tone control characteristics are perfectly flat and absolutely no waviness exists.

Figures 7, 8:
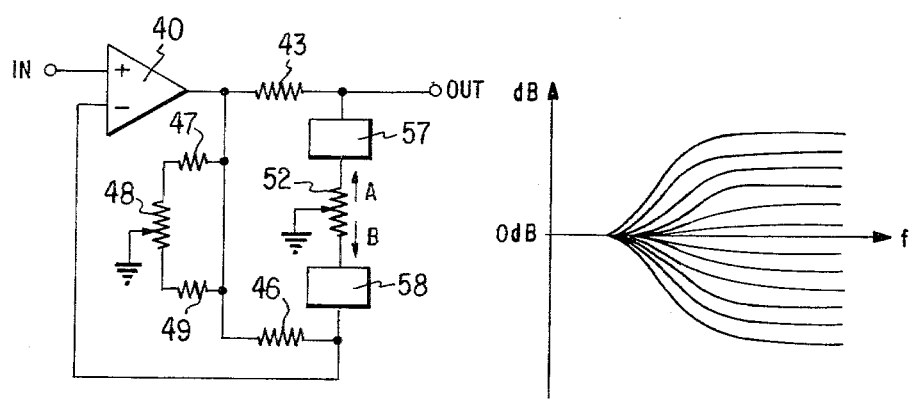

In the range of input frequencies with sufficiently high frequency input signals, the reactance of the capacitance $C_A$ of capacitors 42 and 45 becomes small enough to be regarded as a short-circuit. Therefore, the low-pass side circuit becomes irrelevant and the equivalent circuit as shown in FIG. 7 results. Thus, when a variable resistor, for example a B-type variable resistor, is used as variable resistor 52, in which the rotation angle with respect to the clockwise and counterclockwise rotation of the slider with the center of the rotation angle as the reference point and the resistance variability are fixed, the boosting and cutting variations of the treble become line-symmetric with respect to the frequency axis f as shown in FIG. 8, and tone control characteristics with extremely favorable curve variation characteristics can be obtained. Rotation of the slider in the direction of the arrow A in FIG. 7 results in high-pass cut, and rotation of the slider in the direction of the arrow B results in high-pass boost.

Figures 9, 10:
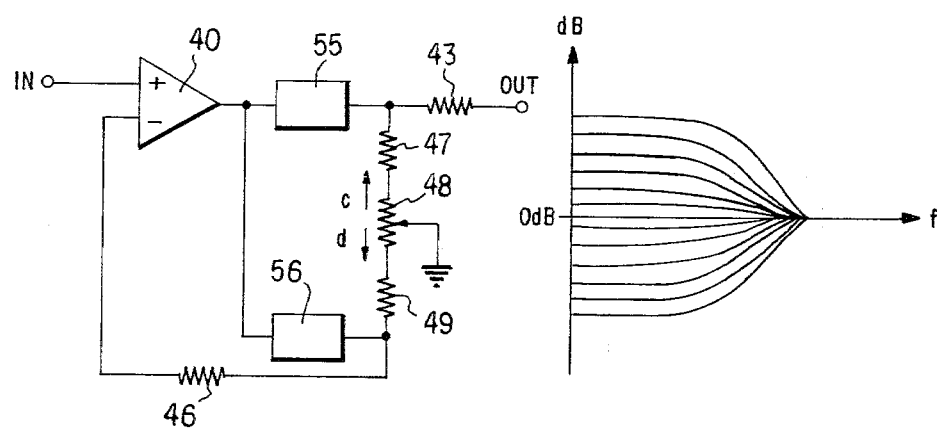

Next, in the range of the input frequency with sufficiently low frequency input signals, the reactance of the capacitance $C_B$ of capacitors 51 and 53 becomes large enough to regard it as open-circuited. Consequently, the high-pass side circuit comprised of resistors 50, 54, capacitors 51 and 53, and variable resistor 52 is cut off becoming irrelevant, and the equivalent circuit as shown in FIG. 9 results. Thus, when a variable resistor, for example a B-type variable resistor, is used as variable resistor 48, the boosting and cutting variation of the bass becomes line-symmetric with respect to the frequency axis f as shown in FIG. 10 and tone control characteristics with extremely favorable curve variation characteristics can be obtained.

Rotation of the slider in the direction of the arrow c in FIG. 9 results in low-pass cut, and rotation of the slider in the direction of arrow d results in low-pass boost.

As explaind above, when the tone control circuit of this invention is used, a variable resistor with simple B-type construction can be used as variable resistors 48 and 52, and when the slides of variable resistors 48 and 52 are set at the center of the rotation angle, a flat frequency characteristic can be obtained, the frequency characteristic having no waviness. In addition, the gain of the control circuit is 1, and the input impedance can be set high. A tone control circuit can also be inserted immediately behind the variable resistor. There is little interference between the high-pass side circuits and the low-pass side circuits and the curve variation with respect to the rotation angle of the variable resistor is line-symmetric with respect to the frequency axis. Tone control characteristics with an extremely favorable curve variation characteristic can also be obtained.

When the circuit is set so that the relationship of (a) $R_A = \alpha R_C$ holds between resistance $R_A$ of resistors 41 and 44 and resistance $R_C$ of resistors 43 and 46, assuming that $\alpha$ is a positive real number, (b) $R_B = \alpha R_D$, between resistance $R_B$ of resistors 47 and 49 and resistance $R_D$ of resistors 50 and 54; and (c) $V_{R1} = \alpha V_{R2}$, between resistance $V_{R1}$ of variable resistor 48 and resistance $V_{R2}$ of variable resistor 52, the equivalent circuit at a frequency with sufficiently low frequency input signals is as shown in FIG. 11, the equivalent circuit at a frequency with sufficiently high frequency input signals being as shown in FIG. 12 where for explanatory purpose, resistance values are shown in parentheses in these Figures.

Thus, when variable resistors having the same resistance variability with respect to rotation angle are used as variable resistors 48 and 52, the relationships, $r_3 = r_1/\alpha$ and $r_4 = r_2/\alpha$ hold for identical rotation angles. Consequently, the transfer functions of the equivalent circuits in FIGS. 11 and 12 become absolutely identical when the rotation angles of variable resistors 48 and 52 from their centers are identical. Therefore, when variable resistors having identical rotation angle to resistance variabilities are used for variable resistors 48 and 52 and the rotation angles of the sliders are the same, high-pass and low-pass boosting and cutting become identical when compared at a sufficiently low frequency in the low-pass and compared at a sufficiently high frequency in the high-pass so that the tone control characteristics shown in FIG. 13(a) are obtained. FIG. 13(b) shows by numbers the positions of the sliders of variable resistors 48 and 52 due to rotation and these numbers correspond to the numbers in FIG. 13(a).

Figure 14:
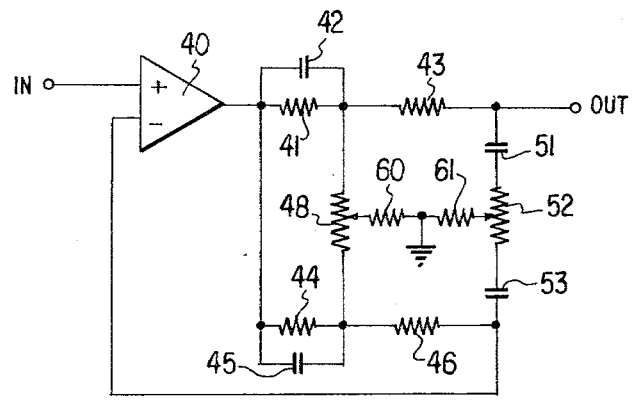
FIGS. 14, 15 and 16 are circuit diagrams of modified embodiments of the first embodiment of this invention.
Figure 15:
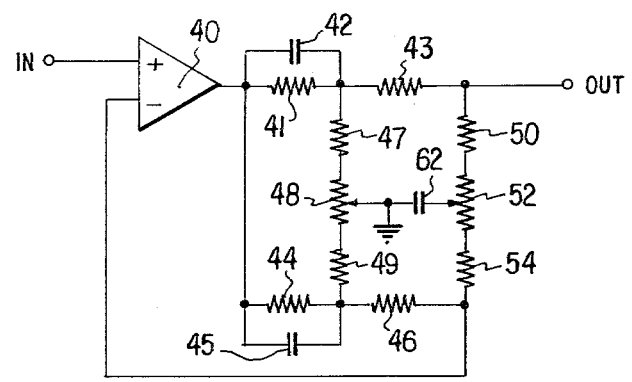
Figure 16:
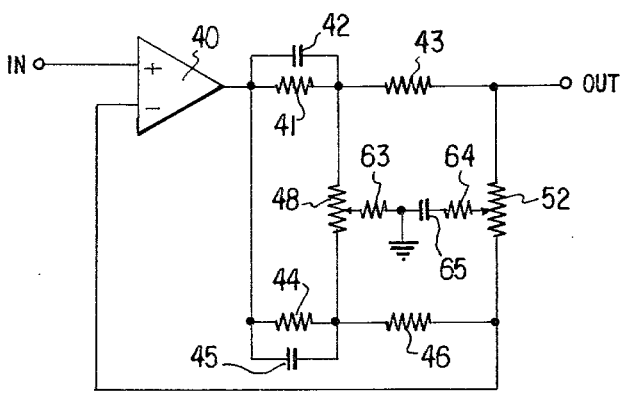

FIGS. 14, 15 and 16 are circuit diagrams of tone control circuits of modified embodiments of this invention. The tone control circuit of FIG. 14 eliminates resistors 47, 49, 50 and 54 of the tone control circuit shown in FIG. 5, resistors 60 and 61 being respectively connected between the sliders of variable resistors 48 and 52 and ground.

The tone control circuit of FIG. 15 eliminates capacitors 51 and 53 of the tone control circuit shown in FIG. 5, a capacitor 62 being connected between the slider of variable resistor 52 and ground.

The tone control circuit of FIG. 16 eliminates resistors 47, 49, 50 and 54 and capacitors 51 and 53 of the tone control circuit shown in FIG. 5, resistor 63 being connected between the slider of the variable resistor 48 and ground and resistor 64 and capacitor 65 being connected in series circuit between the slider of variable resistor 52 and ground.

With respect to the tone control circuits shown in FIGS. 14, 15 and 16, when the resistance and capacitance of the corresponding resistors and capacitors of the output circuit and the feedback circuit are set equal respectively, the equivalent circuits for the high-pass, mid-pass, and low-pass input frequencies of these tone control circuits are the same as those for the tone control circuit of FIG. 5. Further, the operation is also the same. Thus, a detailed explanation is omitted here.

As explained above, when this invention is employed, the following effects are achieved: (a) when the tone control characteristic is flat, the gain is 1 and no inversion of phase occurs. Consequently, when it is used in a preamplifier, etc. where many amplifiers are arranged in cascade connection, the setting of gain is very easy; (b) interference between the high-pass side circuits and the low-pass side circuits is minimal, and the tone control characteristic is linearly symmetric with respect to the frequency axis; (c) a B-type variable resistor having a simple rotation angle to resistance variability characteristics can be used as the variable resistor for the high-pass and low-pass controls; (d) by using variable resistors having the same rotation angle to resistance variability characteristics as the variable resistors for high-pass and low-pass controls, the boosting and cutting variations with respect to the slider rotation angle of the variable resistors can be made the same between the high-pass and the low-pass; (e) the input impedance is high and there is no insertion loss; and (f) because it is constructed with resistors and capacitors of the same values forming pairs, design is extremely easy.

Figures 18, 19:
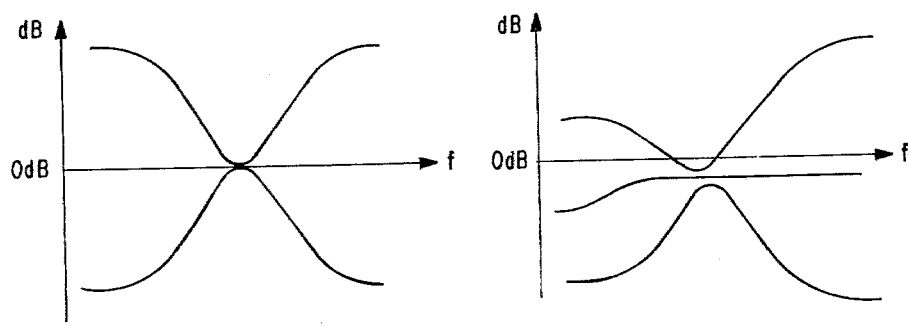
FIG. 18 is a tone control characteristic diagram of the tone control circuit of FIG. 17.
FIG. 19 is a tone control characteristic diagram of the tone control circuit in FIG. 17 with a heavy load connected thereto.

As indicated above, the resistances and the capacitances of the corresponding resistors and capacitors may be specially selected to be equal, for example, the resistances of resistors 41 and 44 to be equal, the capacitances of capacitors 42 and 45 to be equal, etc., and the resistances of the resistors of variable resistors 48 and 52 may be set equal with the sliders in the center positions respectively. Further, variable resistors 48 and 52 preferably are of the B-type and have a linear characteristic of resistance variability to slider position. When the foregoing conditions are met, the tone control characteristics of the tone control circuit shows equal attenuation of the output circuit and feedback of the feedback circuit as indicated in FIG. 18. Further, the gain becomes 0 dB and absolutely flat characteristics are obtained without waviness. Also, when deviations from the center positions of the sliders of variable resistors 48 and 52 are the same, equal amounts of cutting and boosting are obtained so that the tone control characteristics obtained are perfectly line-symmetric with respect to the frequency axis.

Figure 17:
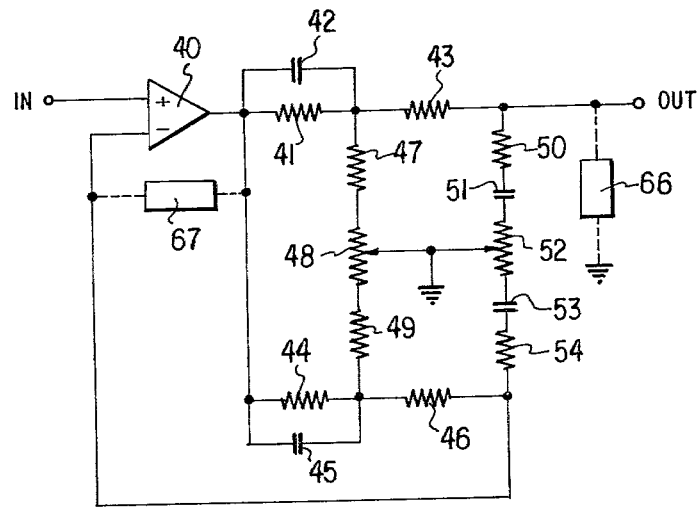
FIG. 17 is a circuit diagram of a tone control circuit corresponding to FIG. 5 which illustrates a potential shortcoming thereof.

If (a) a load 66 (see FIG. 17) is connected to the output terminal OUT and/or an impedance circuit 67 is connected between the output terminal and the inverting input terminal of operational amplifier 40, (b) the load driving capability of amplifier 40 is sufficient, and (c) the resistance and capacitance of resistors 41, 43, 44, 46, 47, 49, 50 and 54, capacitors 42, 45, 51 and 53, and variable resistors 48 and 52 can be set sufficiently low—that is, when the output impedance of the tone control circuit is sufficiently less than the impedance of load 66, then load 66 can be regarded as open-circuited and the tone control characteristics of the tone control circuit are as shown in FIG. 18. However, when the load driving capability of operational amplifier 40 is insufficient, or when the impedances of the resistors, variable resistors, and capacitors that comprise the said tone control circuit must be set sufficiently high, the output impedance necessarily becomes large and is strongly subjected to the influence of the load. The same is true in the case of impedance circuit 67.

Figure 20:
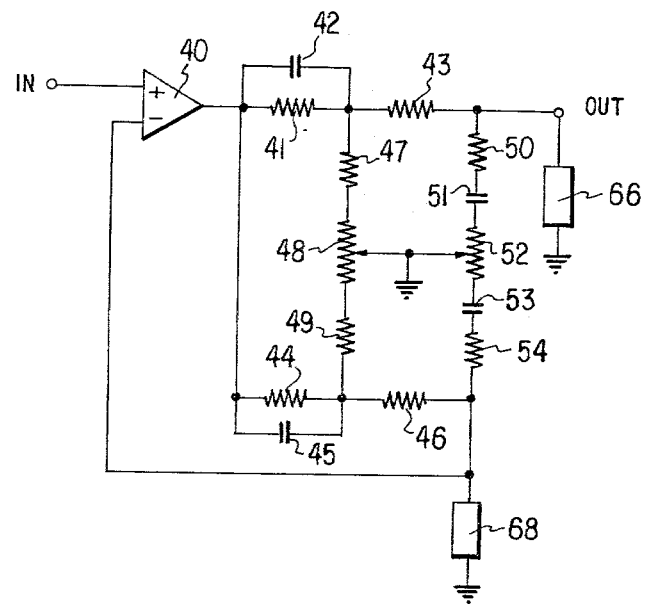
FIGS. 20–23 are circuit diagrams of tone control circuit of further modified embodiments of this invention.

Thus, the tone control characteristics in this case may show attenuation of the flat characteristic over the entire frequency range as shown in FIG. 19, causing waviness in the low-pass region and lack of symmetry with respect to the frequency axis of the boosting and cutting characteristics. Although the problem can be eliminated by connecting a buffer amplifier with sufficiently large input impedance as the load, the circuit tends to become complicated as a whole and expensive. The circuitry of FIG. 20 eliminates the abovementioned shortcomings. In the tone control circuit of this embodiment, load 66 is connected to the output terminal OUT in the tone control circuit and an impedance circuit 68, having an impedance equal to the impedance of load 66 is connected to the inverting input terminal of operational amplifier 40. Thus, the output circuit containing load 66 maintains perfect symmetry with respect to the feedback circuit containing the impedance circuit 68. By selecting identical resistances and capacitances for the respective pairs of resistors, variable resistors, and capacitors of the tone control circuit, perfectly flat tone control characteristics which are line-symmetric to the frequency axis can be maintained. Thus, even in the case of a heavy load, it is unnecessary to connect a buffer amplifier with a large input impedance, etc. in cascade arrangement. Rather, clean, symmetric tone control characteristics can be obtained by simply connecting impedance circuit 68.

Figure 21:
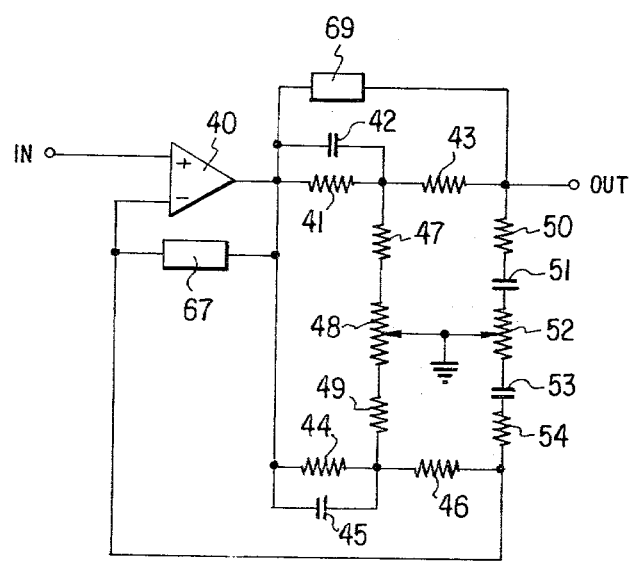

FIG. 21 is a circuit diagram of a tone control circuit of this invention in accordance with another modified embodiment. The tone control circuit of this embodiment is based on the tone control circuit shown by solid lines in FIG. 17. Impedance circuit 67 is connected between the output terminal and the inverting input terminal of operational amplifier 40. Impedance circuit 69, with the same impedance as impedance circuit 67, is connected between the output terminal of operational amplifier 40 and the output terminal OUT. Thus, the feedback circuit containing impedance circuit 67 maintains perfect symmetry with respect to the output circuit containing impedance circuit 69. By selecting the same resistances and capacitances for the respective pairs of resistors, variable resistors, and capacitors of the tone control circuit, tone control characteristics that are perfectly flat and line-symmetric with respect to the frequency axis as shown in FIG. 18 can be maintained. In other words, even when an impedance such as DC feedback resistor is connected to operational amplifier 40, clean, symmetrical tone control characteristics can be obtained. Also, when impedance circuit 67 is a DC feedback resistor, there tends to be a problem in that an excessive increase in the resistance of the DC feedback resistors deteriorates the drift characteristic. However, with the circuitry of FIG. 21, a suitable DC feedback resistance can be selected and the drift characteristics improved.

Figure 22:
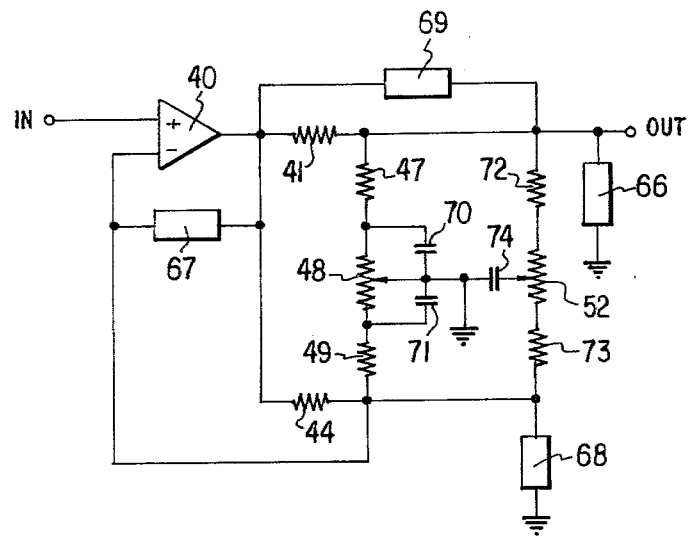

FIG. 22 is a circuit diagram of a tone control circuit in accordance with a further modified embodiment of this invention. The circuit of this modified embodiment is based on the tone control circuit shown in FIG. 17. Capacitors 42 and 45 are eliminated and capacitors 70 and 71 are individually connected between the two terminals of variable resistor 48 and its slider. Resistors 43, 46, 50 and 54 and capacitors 51 and 53 are eliminated wth resistors 72 and 73 being employed in place of resistors 50 and 54. Capacitor 74 is connected between the slider and the ground terminal of variable resistor 52. Load 66 is connected to the output terminal OUT. The impedance circuit 68 having the same impedance as the impedance of load 66 is connected to the inverting input terminal of operational amplifier 40. Impedance circuit 67 is connected between the output terminal and the inverting input terminal of operational amplifier 40 while impedance circuit 69, with an impedance equal to that of impedance circuit 67, is connected between the output terminal of operational amplifier 40 and the output terminal OUT.

In this modified embodiment also, the output circuit and the feedback circuit are in perfect symmetry by sharing capacitor 74. By selecting the same resistances and the same capacitances for respective pairs of resistors, variable resistors, and capacitors of the tone control circuit, tone control characteristics that are perfectly flat and line-symmetric with respect to the frequency axis as shown in FIG. 18 can be maintained. It should also be noted, with respect to the claims appended hereto, that the circuit from the connection point between resistors 41 and 47 to the output terminal OUT may be considered a short circuit or the connection point may simply be considered the output terminal OUT. In other words, the impedances of load 66 and impedance circuit 67 do not affect the tone control characteristics.

Figure 23:
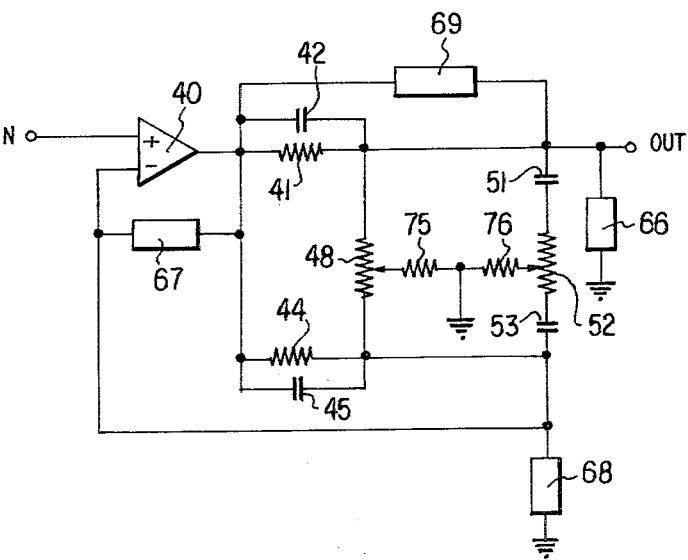

FIG. 23 is a circuit diagram of a tone control circuit of another modified embodiment of this invention. The tone control circuit of this modified embodiment is constructed by short-circuiting resistors 47 and 49 in the tone control circuit shown in FIG. 17 and connecting resistor 75 between the slider of variable resistor 48 and ground; short-circuiting resistors 43, 46, 50, 54 and connecting resistor 76 between the slider of variable resistor 52 and ground; and by connecting load 66, impedance circuit 68 having the same impedance as load 66, impedance circuit 67, and impedance circuit 69 having the same impedance as impedance circuit 67 the same as in FIG. 22.

In this modified embodiment also, the output circuit and the feedback circuit are in perfect symmetry by sharing resistors 75 and 76, and by selecting the same resistances and the same capacitances for the respective pairs of resistors, variable resistors, and capacitors of the tone control circuit, tone control characteristics that are perfectly flat and line-symmetric with respect to the frequency axis as shown in FIG. 18 can be maintained. Also, in FIG. 23, the same result can be obtained by short-circuiting the capacitors 51 and 53 and connecting a different capacitor between the slider of variable resistor 52 and resistor 76. As explained above, when this invention is used, clean tone control characteristics without interference which are symmetric with respect to the frequency axis can be obtained even when elements other than the resistors, variable resistors, and capacitors that determine the tone control characteristics are used such as a load or DC feedback resistor of an operational amplifier. Also, it is unnecessary to cascade-connect a buffer amplifier with a high input impedance as a load. Thus, a simplified and inexpensive circuit construction as a whole results. In addition, selecting an excessively high value of DC feedback resistance for the operational amplifier to maintain the tone control characteristics tends to adversely affect the drift characteristics of the operational amplifier. However, by employing this invention, the optimum DC feedback resistance can be selected without sacrificing the tone control characteristics, which enables improvement of the performance.

Figure 24:
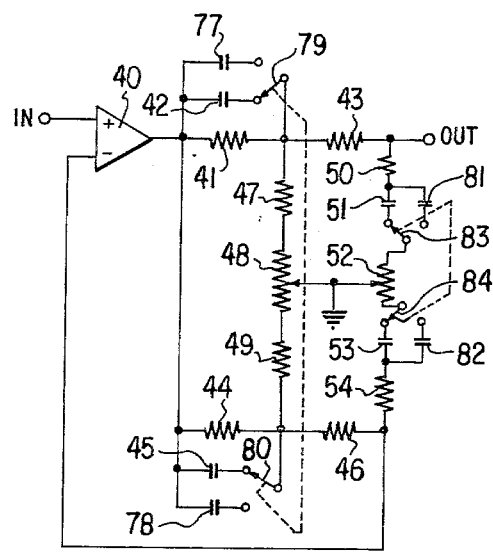
FIG. 24 is a circuit diagram of a tone control circuit having a conventional switching mechanism for turnover frequency, etc.

FIG. 24 is a schematic diagram of a tone control circuit with a turnover frequency and roll-off frequency (noted as turnover frequency, etc. hereafter) switching mechanism where the tone control circuit is obtained by adding to the tone control circuit of FIG. 5, interlocked, change-over switches 79 and 80 whose movable pieces are individually connected to the common connection point of resistors 41 and 43 and the common connection point of resistors 44 and 46 respectively. These switches switch capacitors 42 and 45 and capacitors 77 and 78 as pairs so that capacitors 42 and 45 or capacitors 77 and 78 are connected individually in parallel to resistors 42 and 49. Interlocked change-over switches 83 and 84 are separately installed between capacitor 51 and one end of variable resistor 52 and between capacitor 53 and the other end of variable resistor 52 respectively so that capacitors 51 and 53 are switched as a pair to capacitors 81 and 82 by switching change-over switches 83 and 84.

Figure 25:
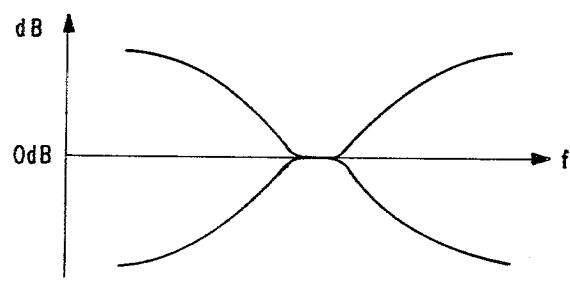
FIG. 25 is a tone control characteristic diagram for the tone control circuit in FIG. 24 for a certain configuration of the switching mechanism.

When capacitors 42 and 45 and 77 and 78 are switched in pairs by change-over switches 79 and 80, which changes the low-pass cut-off frequency (or switches the low-pass turnover frequency, etc.) and capacitors 51 and 53 and 81 and 82 are switched as pairs by change-over switches 83 and 84 to thereby change the high-pass cut-off frequency (or switching the high-pass turnover frequency, etc.), the tone control characteristics shown in FIG. 25 with solid and broken lines are obtained. However, with the tone control circuit of FIG. 1, two sets of change-over switches 79, 80, 83 and 84 in interlocked operation are required to switch the turnover frequency, etc., and capacitors twice in number of the turnover frequencies, etc., 77, 78, 81 and 82 are required resulting in complex circuit construction.

The circuitry of FIG. 27 reduces the number of change-over switches required for switching the turnover frequency and roll-off frequency and the number of capacitors that determine the turnover frequency and the roll-off frequency in accordance with a further aspect of the invention. The tone control circuit of this embodiment is based on the tone control circuit of FIG. 5. The movable piece of a change-over switch 86 is connected to the common connection point of variable resistor 48 and resistor 49. A capacitor 85 is connected between the contact 86-2 of change-over switch 86 and the common connection point of resistor 47 and variable resistor 48 so that capacitor 85 is connected in parallel to variable resistor 48 when the movable piece of change-over switch 86 is in contact with contact point 86-2. The movable piece of a change-over switch 88 is grounded and connected to the slider of variable resistor 52. The contact 88-1 of change-over switch 88 is connected to the slider of variable resistor 52 while a capacitor 87 is connected between contact point 88-2 and the slider of variable resistor 52. Thus, the slider of variable resistor 52 is directly grounded when the movable piece of change-over switch 88 is in contact with contact point 88-1, the slider being grounded through capacitor 87 when the movable piece of change-over switch 88 is in contact with contact point 88-2.

Accordingly, the same circuit configuration as the tone control circuit of that shown in FIG. 5 results when the movable piece of change-over switch 86 is in contact with contact point 86-1 and the movable piece of change-over switch 88 is in contact with contact point 88-1. The tone control characteristics shown in FIG. 26 with solid lines can thus be obtained.

When the movable piece of change-over switch 86 is in contact with contact point 86-2, capacitor 85 is connected in parallel with variable resistor 48 and the low-pass cut-off frequency changes. The characteristics of the switched turnover frequency, etc. are as shown on the left side of FIG. 26 with broken lines. For example, when the capacitance of capacitor 85 is selected to be the same as the capacitance of capacitor 42, the resulting cut-off frequency becomes approximately the ½ the cut-off frequency when capacitor 85 is not operational. When the movable piece of change-over switch 88 is in contact with contact point 88-2, the slider of variable resistor 52 is grounded across capacitor 87 and the high-pass cut-off frequency changes. The characteristics of the switched turnover frequency, etc. are as shown on the right side of FIG. 26 with broken lines. For example, when the capacitance of capacitor 87 is selected to be the same as the capacitance of capacitor 51, the resulting cut-off frequency becomes approximately double the cut-off frequency when capacitor 87 is not operational. The capacitances for capacitors 85 and 87 may be selected respectively so that the desired turnover frequency, etc. is obtained.

With the present invention, as is obvious from comparison with the tone control circuit of FIG. 24, the number of change-over switches and capacitors required for switching the turnover frequency, etc. is reduced by one-half and the circuit configuration is also simplified. Further, symmetry between the output circuit and the feedback circuit is maintained; especially when the resistances and capacitances of the paired resistors, variable resistors, and capacitors are selected to be equal values respectively as indicated above, the tone control characteristics of flatness and linear symmetry with respect to the frequency axis are maintained.

A modified embodiment of the invention will now be described with respect to FIG. 28. The tone control circuit of this modified embodiment is based on the tone control circuit shown in FIG. 5 by connecting the movable piece of a change-over switch 90 to the common connection point of resistor 49 and variable resistor 48. One end of capacitors 89-1, 89-2, ... 89-n are connected in common to the common connection point of resistor 47 and variable resistor 48 while the opposite ends thereof are respectively connected to contact points 90-1, 90-2 . . . 90-n of change-over switch 90. Further, one end of capacitors 91-1, 91-2, . . . 91-n are connected in common to the slider of variable resistor 52 while the opposite ends thereof are respectively connected to contact points 92-1, 92-2, . . . 92-n of change-over switch 92 whose movable piece is grounded and connected to the slider of variable resistor 48. The circuit generally corresponds to that of FIG. 27 where a plurality of different capacitors 89-1, 89-2, . . . and 91-1, 91-2 . . . respectively correspond to capacitors 85 and 87. Thus, in the case of this modified embodiment, the low-pass side cut-off frequency or the high-pass side cut-off frequency may be respectively changed by changing the contact positions that the movable pieces of change-over switches 90 and 92 contact. Hence, by switching the high-pass side and/or low-pass side turnover frequency, etc. by switching change-over switches 90 and/or 92, the tone control characteristics shown in FIG. 29 can be obtained.

In this modified embodiment, the symmetry of the output circuit and the feedback circuit is also maintained at the respective positions switched by the change-over switches 90 and 92. When the resistances and the capacitances of the pairing resistors, variable resistors, and capacitors are specially selected to have equal values, the flatness and the linear symmetry with respect to the frequency axis are maintained in the tone control characteristics. Further, resistors 47 and 49 may be short-circuited and a different resistor may be connected between the slider of variable resistor 48 and ground. Or, resistors 43, 46, 50 and 54 may be short-circuited and a different resistor may be connected between the slider of variable resistor 52 and the common connection point A of capacitor 87 and contact point 88-1 or between the slider of the variable resistor and the common connection point A of capacitors 91-1, 91-2, . . . 91-n. Or, capacitors 42 and 45 may be short-circuited and a different capacitor may be connected between the slider of variable resistor 48 and ground. Alternatively, capacitors 51 and 53 may be short-circuited and a different capacitor connected between the slider of variable resistor 52 and point A.

FIG. 30 is a circuit diagram of a tone control circuit of another embodiment of this invention. The tone control circuit of this embodiment is constructed by connecting in series, a first parallel circuit consisting of resistor 101 and capacitor 103, a first series circuit consisting of resistor 106, variable resistor 108 and resistor 107 and a second parallel circuit consisting of resistor 102 and capacitor 104, between the input terminal IN and the output terminal OUT of operational amplifier 40. A second series circuit consisting of resistor 109, resistor 111, capacitor 113, variable resistor 115, capacitor 114, resistor 112 and resistor 110 is connected in parallel with the said first series circuit; the slider of variable resistor 108 is directly grounded and the resistor of variable resistor 108 is selectively connected in parallel with capacitor 116 by change-over switch 117. The slider of variable resistor 115 is selectively grounded either directly or through capacitor 118 by change-over switch 119 while the common connection point of resistors 109 and 111 is connected to the non-inverting input terminal of operational amplifier 40 and the common connection point of resistors 110 and 112 to the inverting input terminal of the operational amplifier.

The first and second parallel circuits and the first series circuit are the low-pass side circuits, variable resistor 108 being used for low-pass control. The second series circuit excluding resistors 109 and 110 is the high-pass side circuit, variable resistor 115 being used for high-pass tone control. In the tone control circuit of FIG. 30, the input circuit between the input terminal IN and the non-inverting input terminal of operational amplifier 40 comprises the upper side in FIG. 30 while the feedback circuit between the output terminal OUT and the inverting input terminal of operational amplifier 40 comprises the lower side of FIG. 30, these circuits being symmetric with the ground terminal as the boundary. Variable resistors 108 and 115 may be respectively spanned over the input circuit and the feedback circuit so that by varying the slider positions of the variable resistors, the attenuation is changed at the input circuit and feedback at the feedback circuit. The tone control characteristics are obtained by adding the amounts of attenuation and feedback.

Figure 26:
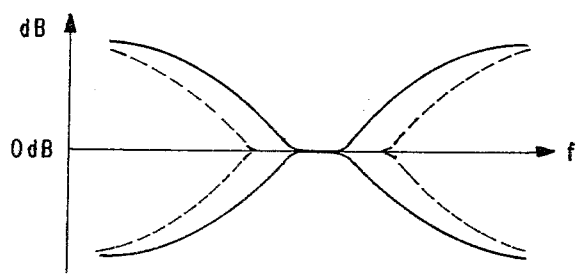
FIG. 26 is a tone control characteristic diagram for the tone control circuit in FIG. 24 for all configurations thereof.

Thus, with this embodiment, the tone control characteristics shown in FIG. 26 with solid lines can be obtained when the movable piece of change-over switch 117 is in contact with contact point 117-1 and the movable piece of change-over switch 119 is in contact with contact point 119-1. When the movable piece of change-over switch 117 is in contact with contact point 117-2, capacitor 116 is connected in parallel with variable resistor 108 and the low-pass cut-off frequency changes. The characteristics of the switched turnover frequency, etc. are as shown on the left side of FIG. 26 with broken lines. When the movable piece of change-over switch 119 is in contact with contact point 119-2, the slider of variable resistor 115 is grounded through capacitor 118 so that the high-pass cut-off frequency changes. The characteristics of the switched turnover frequency, etc. are as shown on the right side of FIG. 26 with broken lines. The capacitances of capacitors 116 and 118 may be selected respectively so that the desired turnover frequency, etc. is obtained.

The symmetry of the input circuit and the feedback circuit is also maintained at the respective positions switched by change-over switches 117 and 119. When the resistances and the capacitances of the pairing resistors, variable resistors, and capacitors are specially selected to have equal values, the flatness and the linear symmetry with respect to the frequency axis are maintained in the tone control characteristics. This is the same as in the first embodiment. Also, when it is desirable to switch a plurality of turnover frequencies, etc., the circuit of FIG. 30 may be modified in a manner similar to FIG. 28.

As explained above, when this invention is employed, the number of change-over switches for switching the turnover frequency, etc. and the number of capacitors that determine the turnover frequency, etc. can be reduced to one-half the number previously needed, which effects a simplified circuit configuration. Consequently, the tone control circuit can be manufactured inexpensively.

It is to be understood that the above detailed description of the various embodiments of the invention is provided by way of example only. Various details of design and construction may be modified without departing from the true spirit and scope of the invention as set forth in the appended claims.

What is claimed is:

1. A tone control circuit comprising
an amplifier having an input signal connected to the non-inverting input thereof;

low frequency-pass circuit means including first and second circuits having the respective inputs thereof connected to the output of the amplifier and a third circuit connected across the outputs of said first and second circuits, at least one of said first, second and third circuits including frequency sensitive means for establishing the cut-off frequency of the low frequency-pass circuit means and said third circuit including a first variable resistor means whose slider is grounded, said first variable resistor controlling the magnitude of the signal components passed by said low frequency-pass circuit means, and high frequency-pass circuit means including a fourth circuit having the input thereof connected to the connection point of said first and third circuits, a fifth circuit having the input thereof connected to the connection point of said second and third circuits; and a sixth circuit connected across the outputs of said fourth and fifth circuits, said sixth circuit including (a) frequency sensitive means for establishing the cut-off frequency of the high frequency-pass circuit means and (b) a second variable resistor means whose slider is grounded for controlling the magnitude of the signal components passed by the high frequency-pass circuit means;

the connection point of said fourth and sixth circuits being the output terminal of the tone control circuit; and the connection point of said fifth and sixth circuits being connected to the inverting input of said amplifier.

2. A tone control circuit as in claim 1 where said first and second circuits each include a resistor and capacitor connected in parallel.

3. A tone control circuit as in claims 1 or 2 where said sixth circuit includes at least one capacitor disposed at each end of said second variable resistor means.

4. A tone control circuit as in claim 3 where said fourth and fifth circuits each include a resistor.

5. A tone control circuit as in claims 1 or 2 where said sixth circuit includes a capacitor through which the slider of said second variable resistor means is grounded.

6. A tone control circuit as in claims 1 or 2 where said third and sixth circuits each include resistors through which the sliders of said first and second variable resistors are respectively grounded.

7. A tone control circuit as in claim 1 where said third circuit includes at least two capacitors, one of which is connected between one end of said first variable resistor and the slider thereof and the other of which is connected between the other end of said first variable resistor and the slider thereof.

8. A tone control circuit as in claims 1 or 2 where said third circuits includes at least one capacitor connected across said first variable resistor means.

9. A tone control circuit as in claims 1 or 2 where said fourth and fifth circuits comprise short-circuits.

10. A tone control circuit as in claim 1 where the impedances of said first and second circuits are substantially equal as are the impedances of said fourth and fifth circuits.

11. A tone control circuit as in claim 10 where the impedance of said third circuit from the connection point of said first and third circuits through the slider of said first variable resistor means to ground is substantially equal to the impedance of the third circuit from the connection point of said second and third circuits through the slider of said first variable resistor means to ground and where the impedance of said sixth circuit from the connection point of said fourth and sixth circuits through the slider of said second variable resistor means to ground is substantially equal to the impedance of the sixth circuit from the connection point of said fifth and sixth circuits through the slider of said second variable resistor means to ground.

12. A tone control circuit as in claims 10 or 11 including a load impedance connected between said output terminal and ground and a further impedance connected between the inverting input of the amplifier and ground, said further and load impedances being substantially equal in value.

13. A tone control circuit as in claims 10 or 11 including a feedback impedance connected between said output of the amplifier and the inverting input thereof and a further impedance connected between the output of the amplifier and the output terminal of the tone control circuit, said feedback and further impedances being substantially equal in value.

14. A tone control circuit as in claims 1 or 2 where said third circuit includes at least one capacitor and first switching means for selectively switching said one capacitor across said first variable resistor means for varying said cut-off frequency of the low frequency-pass circuit means and where said sixth circuit includes at least one capacitor and second switching means for selectively grounding the slider of said second variable resistor through said last-mentioned one capacitor for varying said cut-off frequency of the high frequency-pass circuit means.

15. A tone control circuit as in claim 14 where said third and sixth circuits each include a plurality of said capacitors respectively connected to said first and second switching means so that the cut-off frequencies of said low frequency-pass and said high frequency-pass circuit means can be adjusted to a plurality of different values.

16. A tone control circuit as in claim 14 where said third and sixth circuits each include a plurality of said capacitors respectively connected to said first and second switching means so that the cut-off frequencies of said low frequency-pass and said high frequency-pass circuit means can be adjusted to a plurality of different values.

17. A tone control circuit comprising an amplifier, the output of which is the output terminal of the tone control circuit;

low frequency-pass circuit means including a first circuit having the input thereof connected to an input signal, a second circuit and a third circuit connected across the outputs of said first and second circuits, at least one of said first, second and third circuits including frequency sensitive means for establishing the cut-off frequency of the low frequency-pass circuit means and said third circuit including a first variable resistor means whose slider is grounded, said first variable resistor controlling the magnitude of the signal components passed by said low frequency-pass circuit means, and high frequency-pass circuit means including a fourth circuit having the input thereof connected to the connection point of said first and third circuits, a fifth circuit having the input thereof connected to the connection point of said second and third circuits; and a sixth circuit connected across the outputs of said fourth and fifth circuits, said sixth circuit including (a) frequency sensitive means for establishing the cut-off frequency of the high frequency-pass circuit means and (b) a second variable resistor means whose slider is grounded for controlling the magnitude of the signal components passed by the high frequency-pass circuit means;

the connection point of said fourth and sixth circuits being connected to the non-inverting input terminal of the amplifier;

the connection point of said fifth and sixth circuits being connected to the inverting input of said operational amplifier; and the output of the amplifier being connected to the input of the second circuit.

18. A tone control circuit as in claim 17 where said first and second circuits each include a resistor and capacitor connected in parallel.

19. A tone control circuit as in claims 17 or 17 where the impedances of said first and second circuits are substantially equal as are the impedances of said fourth and fifth circuits.

20. A tone control circuit as in claim 19 where the impedance of said third circuit from the connection point of said first and third circuits through the slider of said first variable resistor means to ground is substantially equal to the impedance of the third circuit from the connection point of said second and third circuits through the slider of said first variable resistor means to ground and where the impedance of said sixth circuit from the connection point of said fourth and sixth circuits through the slider of said second variable resistor means to ground is substantially equal to the impedance of the sixth circuit from the connection point of said fifth and sixth circuits through the slider of said second variable resistor means to ground.

21. A tone control circuit as in claims 17 or 18 where said third circuit includes at least one capacitor and first switching means for selectively switching said one capacitor across said first variable resistor means for varying said cut-off frequency of the low frequency-pass circuit means and where said sixth circuit includes at least one capacitor and second switching means for selectively grounding the slider of said second variable resistor through said last-mentioned one capacitor for varying said cut-off frequency of the high frequency-pass circuit means.

22. A tone control circuit as in claims 1 or 17 where said amplifier is an operational amplifier.

* * * * *